United States Patent [19]

Matsuo et al.

[11] Patent Number: 4,564,997
[45] Date of Patent: Jan. 21, 1986

[54] SEMICONDUCTOR DEVICE AND MANUFACTURING PROCESS THEREOF

[75] Inventors: Seitaro Matsuo; Susumu Muramoto, both of Hachioji; Kohei Ehara, Kodaira; Manabu Itsumi, Hoya, all of Japan

[73] Assignee: Nippon-Telegraph and Telephone Public Corporation, Japan

[21] Appl. No.: 369,235

[22] Filed: Apr. 16, 1982

[30] Foreign Application Priority Data

Apr. 21, 1981 [JP] Japan .................. 56-61066
Apr. 21, 1981 [JP] Japan .................. 56-61067
Apr. 21, 1981 [JP] Japan .................. 56-61068
Apr. 21, 1981 [JP] Japan .................. 56-61069

[51] Int. Cl.$^4$ ............... H01L 21/76; H01L 21/302
[52] U.S. Cl. ............................ 29/576 W; 29/571; 29/578; 29/589; 29/591; 148/1.5; 148/DIG. 50; 148/DIG. 131; 427/47; 427/38; 427/39; 156/647; 156/657; 357/55
[58] Field of Search ............ 29/571, 576 W, 578, 29/589, 576 B, 591; 148/1.5, 187, 188, DIG. 118, DIG. 50, DIG. 131, DIG. 105, DIG. 106; 427/38, 39, 93, 94, 95, 47; 156/647, 648, 657, 662; 357/55

[56] References Cited

U.S. PATENT DOCUMENTS

| | | | |
|---|---|---|---|
| 3,856,588 | 12/1974 | Hashimoto et al. | 148/1.5 X |
| 4,004,044 | 1/1977 | Franco et al. | 29/578 X |
| 4,401,054 | 8/1983 | Matsuo et al. | 427/47 X |
| 4,407,851 | 10/1983 | Kurosawa et al. | 29/571 X |
| 4,419,810 | 12/1983 | Riseman | 29/571 |
| 4,440,804 | 4/1984 | Milgram | 427/38 X |
| 4,445,967 | 5/1984 | Kameyama | 148/187 X |
| 4,448,800 | 5/1984 | Ehara et al. | 156/647 X |
| 4,469,527 | 9/1984 | Sugano et al. | 29/571 X |
| 4,481,229 | 11/1984 | Suzuki et al. | 427/47 X |

OTHER PUBLICATIONS

Sze, "VLSI Technology", McGraw-Hill Book Co., 1983, p. 125.
"ECR CVD", Nikkei: Micro devices, 1985, pp. 93-100.
Arai, "Submicron MOS VLSI Process Technologies", IEDM 83, pp. 19-22.
Wakita et al., "Small Surface Damage Facet Coating on InGaAsP/InP Laser by ECR Plasma Deposition", Jap. Jour. Appl. Phy. vol. 23, No. 8, Aug. 1984, pp. L556-L558.

*Primary Examiner*—Brian E. Hearn
*Assistant Examiner*—David A. Hey
*Attorney, Agent, or Firm*—McGlew and Tuttle

[57] ABSTRACT

A semiconductor device in which a film of an insulator a conductor is closely deposited in a groove formed in a semiconductor substrate or an insulating or conductor layer thereon to planarize the surface thereof.

A semiconductor device manufacturing process in which a specimen is selectively etched away through using a resist pattern as a mask, a pattern forming film is deposited by a plasma deposition technique on the specimen, and the resist film is removed, whereby the pattern forming film closed fills up a groove formed by etching to provide a planarized surface.

6 Claims, 51 Drawing Figures

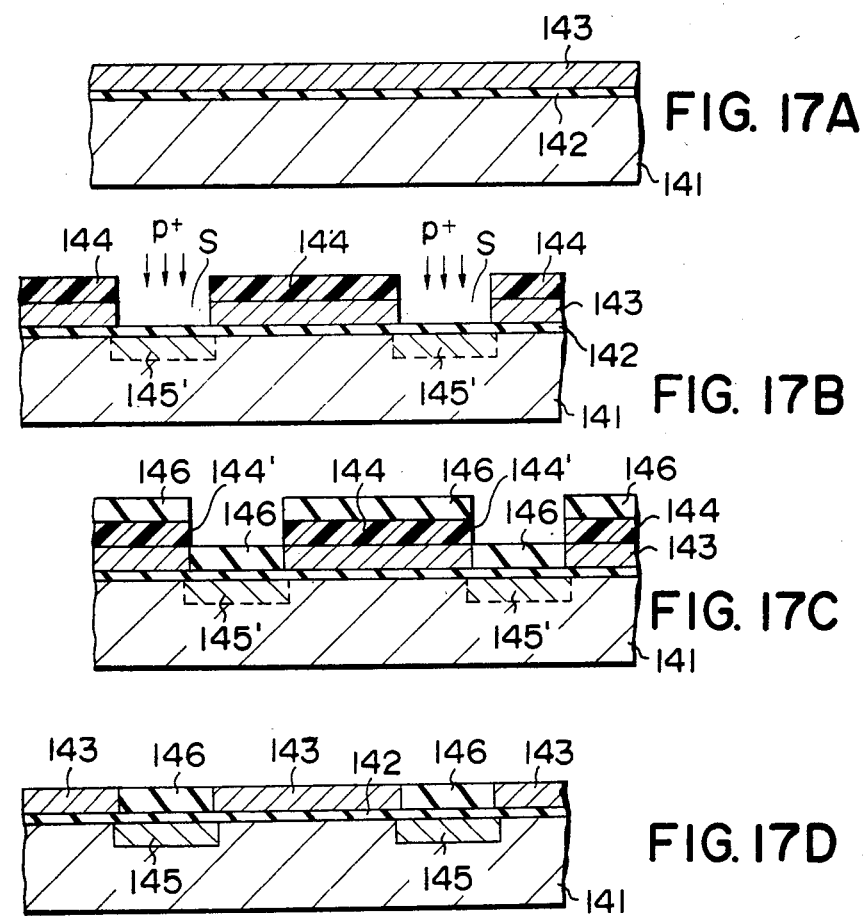

SEMICONDUCTOR DEVICE AND MANUFACTURING PROCESS THEREOF

BACKGROUND OF THE INVENTION

1. Field of the Invention

The present invention relates to a semiconductor device which is almost free from what is called a surface step and can be fabricated with high packing density. The invention also pertains to a manufacturing process of such a semiconductor device.

2. Description of the Prior Art

Semiconductor devices have made remarkable progress in technologies for high packing density, high operating speed and low power. For higher packing density, techniques for field isolation, planarization of film surfaces and a multilevel metallization structure must be improved.

In the aspect of microfabrication technology, the definition of a submicron resist pattern has now been made possible with rapid progress in lithographic techniques such as electron beam lithography and X-ray lithography and, due to expeditious progress in dry etching techniques, submicron patterning, too, is becoming a reality. In contrast to such rapid advancement in the techniques for reducing the dimensions in the direction parallel to the specimen surface, the thicknesses of insulating and conducting films for multilevel interconnection in the direction perpendicular to the specimen surface cannot appreciably be reduced for such reasons as follows: (1) From the viewpoint of the electrical characteristics of devices, in order to make the most of improved device performances resulting from a reduction in size in the direction of the specimen surface, a wiring resistance cannot be increased; therefore, the film thickness cannot be decreased. (2) A decrease in the thickness of the insulating or conducting film may sometimes cause an increase in the influence of variation of the film thickness on the wiring resistance, or allow an increase in the number of pin holes, thereby to change the characteristics of the film, resulting in degraded film quality. For these reasons, as LSI becomes higher in packing density with an increase in the number of wiring layers, the height of the so-called surface step tends to increase relative to the dimensions in the direction parallel to the specimen relative surface. The surface step increase introduces poor step coverage of an overlying thin film and the possibilities of shorting and breakage of conducting interconnection lines. Moreover, since lithography is essentially susceptible to the influence of unevenness of the specimen surface, the finished dimensions of a pattern differ according to location on the specimen surface. That is to say, the resist film thickness is large on a depressed portion of the specimen surface and small on its projecting portion; therefore, even if exposed under the same exposure condition over the entire area of its surface, the resist film is developed to varying degrees, resulting in the pattern size on the depressed portion becoming smaller than that on the projecting portion.

A conventional solution to such problems is to increase the thckiness of the film covering the surface step or the resist film. When using a dry etching technique, the ratio in etching rate between the resist film and a film to be etched cannot be set large, so that when the film to be etched is thick, the resist film thickness must also be large enough to function as an etching mask. This, however, develops the defect that minimum film pattern dimensions which are obtainable inevitably become large, because the increased resist film thickness lowers resolution of the resist pattern by lithography. When using a wet etching process, the film being etched is subject to side etching; therefore, if its thickness is large, then its minimum pattern dimensions also increase.

The above indicates that the effect of high packing density is not so much heightened in proportion to an increase in the number of wiring layers for the multilevel interconnection. With a method that merely repeats the process of forming signal layer conductor networks several times, the number of conductive interconnection layers obtainable is only three to four at most.

To overcome the problems discussed above, planarization of each conductive interconnection layer has also been attempted in the past, too. The conventional planarization techniques are, for instance, an aluminum anodic process, a lift-off process and a resin coating process, but none of them is generally employed for the reasons to be given later. The aluminum anodic process is one that planarizes the layer surface by depositing aluminum all over the surface of an underlying layer or film. The aluminum at an area unnecessary for wiring is then converted into aluminum oxide ($Al_2O_3$) through anodization. This process allows multilayer construction and prevents electro-migration, but it is defective in that the packing density is limited because the metallization pattern of the aluminum film has to be designed, in consideration of the anodization.

The lift-off technique is applied to a method of forming conductor networks first and then filling up the space between adjacent conductors with an insulator, or a method of depositing an insulating material in a predetermined pattern first and then forming the conductor networks. In either case, the film quality of the material to be recessed and easiness of the lift-off process are important. In order to carry out the lift-off process with ease, it is necessary that the material to be recessed be deposited, while maintaining the substrate temperature below 100° to 150° C. so as to suppress deposition of the material on the side surfaces of the substrate. The most favorable thin film deposition method in the prior art that meets such a requirement is an ion beam sputter deposition. But this method has such, short comings as follows: First, the density of the deposited film is low and poor in adhesion to the substrate and in acid resistance, and the pin hole density cannot be reduced. This is because the film composition is apt to deviate from its stoichiometric composition. To maintain the stoichiometric composition of the deposited film, a method that involves the addition of gas is generally employed. With this method, however, when adding gas during sputtering, the directionality of sputtered atoms and molecules is impaired to thereby increase the film thickness on the side wall of a surface step, making it impossible to carry out the lift-off process. Second, since the direction of dispersion of the sputtered atoms and molecules is continuously distributed, the side wall of the stepped portion is also deposited with a film of a thickness about one-half that of the film deposited on the flat surface portion. The film deposited on the side wall remains as a burr after the lift-off process. When removing the burr by etching, a groove may sometimes be made at a boundary of the remaining pattern.

Especially for silicon system materials which are important for fabrication of semiconductor integrated circuits, such as silicon nitride ($Si_3N_4$), silicon oxide ($SiO_2$), silicon (Si) and so forth, the ion beam sputter deposition technique has the drawback that high reliability patterning cannot be achieved through utilization of the lift-off technique. In other words, there has been no satisfactory lift-off technique of the abovesaid material because of the absence of a deposition technique capable of producing the high quality film.

With the resin coating technique, satisfactory planarity is unobtainable since the resin film thickness varies with the unevenness of the underlying layer. Accordingly, this method encounters such a problem that the condition of forming a through hole and the coverage of a film deposited upon the resin film differ according to location.

In an MOS LSI, a gate electrode is formed by a heat-resisting conductive layer, e.g. of polysilicon, refractory metal or refractory metal silicide, and source and drain diffusion layers are formed by the self alignment process using a heat-resisting conductive layer as a mask. In a miniaturized MOS LSI, however, although its dimensions are reduced in the direction parallel to the substrate surface, the thickness of the gate electrode cannot be reduced for the reason to be given below in addition to the same reasons as those referred to previously in respect to the interconnection layer.

That is to say, ion implantation is indispensable as an impurity introducing technique suitable for use with miniaturized devices. This is equally true in the case where a minimum pattern width of an LSI is in the submicron range. The gate electrode of the MOS LSI connot be reduced in thickness because it must be sufficiently thick to serve as a mask for ion implantation.

To settle the problems discussed above, it is very important to planarize the gate electrode of the MOS LSI. To this end, a selective oxidation technique for polysilicon and phosphorus-silicate glass flow techniques have heretofore been proposed, but neither of these is satisfactory for perfect planarization.

FIG. 1 illustrates, in cross section, a protion of a conventional MOS LSI. Reference numeral 1 indicates a p type silicon substrate; 2 designates a p type diffusion layer; 3 identifies a thick silicon dioxide film; 3' denotes a silicon dioxide film the thickness of which varies continuously; 4 represents a gate oxide film; 5 shows a gate electrode; 6 refers to an n+ diffusion layer; 7 and 9 signify conductors for wiring; and 8 indicates an insulating film. The thick silicon dioxide film 3 and the p type diffusion layer 2 are provided for electrically isolating transistors A and B from each other. This is a field isolation technology usually employed, and is called a selective oxidation technique since the thick silicon dioxide film 3 is formed by selective thermal oxidation of the surface of the silicon substrate 1 through using an oxidation resisting film as a mask.

This selective oxidation technique is advantageous in the following points: First, impurity introduction for forming the p type diffusion layer 2 and the formation of the thick silicon dioxide film 3 can be effected by one lithography process; second, a surface step is relatively small because the thick silicon dioxide film 3 is partly recessed into the silicon substrate 1.

However, the selective oxidation technique has such defects as follows:

First, there is a limit to miniaturization. The reason is that when forming the thick silicon dioxide film 3, the region 3' of continuously varying thickness (which is called a bird's beak after its cross-sectional configuration) is inevitably formed as shown in FIG. 2, and that the width of the bird's beak 3' (indicated by $l_1$ in FIG. 2) is substantially equal to the thickness of the thick silicon dioxide film 3 (indicated by $t_1$ in FIG. 2) and is limited in reduction. When the thick silicon dioxide film 3 is formed to a thickness of 1 μm, the bird's beak 3' is also about 1 μm wide; therefore, the region of the bird's beak 3' having a total of a 2 μm or so width hinders the effective use of the active device area. At present, a minimum pattern dimension ranges from 1 to 3 μm, and said value of approximately 2 μm in the region of the bird's beak 3' is a serious obstacle to miniaturization. This problem will become more serious when the minimum pattern size is further reduced in future.

Second, long time thermal oxidation is required. For forming a 1 μm thick selective oxide film, five to seven hours are needed in the case of a wet oxidation process which involves heat treatment at 1000° C. This long time thermal oxidation is a problem in that it lowers productivity, grows a stacking fault in the silicon substrate and incurs inconvenient diffusion of the p type diffusion layer. An increase in the oxidation temperature for reducing the oxidation time would result in further growth of the stacking fault and further diffusion of the p type diffusion layer 2.

Third, satisfactory surface planarity cannot always be achieved. With a usual selective oxidation technique, since the oxide film is recessed to a depth about one-half the film thickness into the silicon substrate, a surface step height is about one-half the film thickness. For further reduction of this surface step height, there has been proposed such a method that entirely recesses the selective oxide film into the silicon substrate by forming the selective oxide film after partly etching away the surface of the silicon substrate With the use of this method, it is true that, as shown in FIG. 3, the surface of the selective oxide film (identified by C) and the surface of the silicon substrate surface (indicated by D) can be made level with each other, but a projection (which is called a bird's head after its configuration) 3" is inevitably formed at the peripheral portion of the selective oxide film in addition to the bird's beak 3'. Accordingly, this method cannot achieve satisfactory surface planarity, either.

SUMMARY OF THE INVENTION

It is therefore an object of the present invention to provide a semiconductor device which has a planar surface and is of high packing density.

Another object of the present invention is to provide a fabrication process which permits fabrication of a miniaturized pattern with high accuracy.

Another object of the present invention is to provide a fabrication process which enables easy formation of a field isolation region without introducing a surface step.

Another object of the present invention is to provide a fabrication process which allows the formation of films of various materials on a semiconductor substrate at relatively low temperatures.

Yet another object of the present invention is to provide a fabrication process which is capable of easily forming a multilevel interconnection structure that achieves high packing density.

Briefly stated, according to the present invention, a desired material is deposited by an ECR plasma deposition process in a groove formed in a semiconductor substrate or in an insulating film or metal film on the semiconductor substrate, thereby to planarize its surface. The surface planarization is carried out by depositing the desired material over the entire surface area of the substrate or the insulating or metal film thereon through the ECR plasma deposition process using, as a mask, resist removable by etching, and patterning the deposited film through the lift-off process.

BRIEF DESCRIPTION OF THE DRAWINGS

FIGS. 17A to 17D show, by way of example, steps involved in the fabrication of a portion B in FIG. 13;

DESCRIPTION OF THE PREFERRED EMBODIMENTS

The present invention is intended to planarize the surface of a semiconductor substrate or the substrate surface containing an insulating film and a wiring layer formed thereon, thereby to achieve high packing density. The invention is applicable to a variety of semiconductor integrated circuits.

Figure 4:
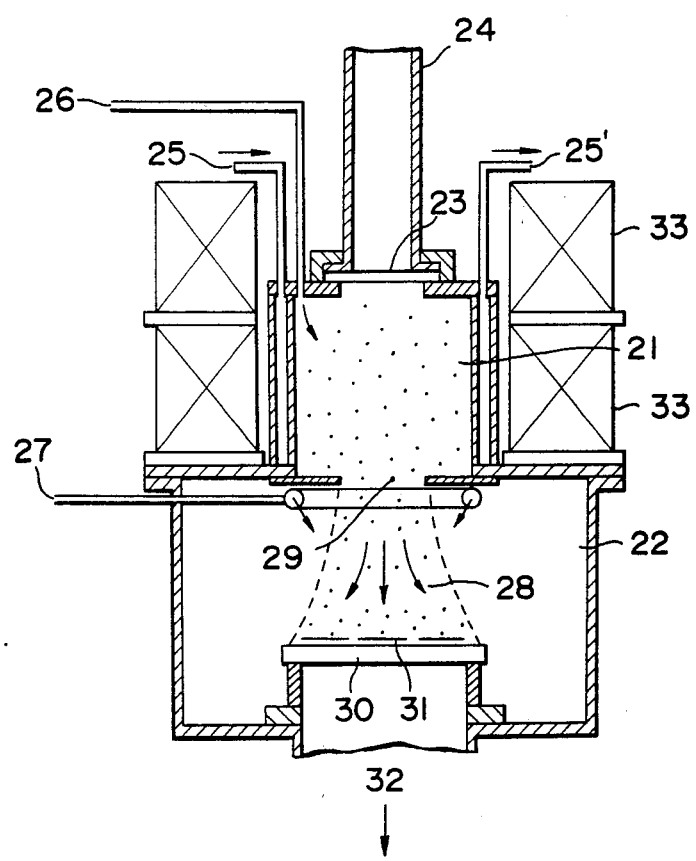
FIG. 4 is a explanatory diagram of an ECR plasma deposition apparatus for use in embodiments of the present invention.

A description will be given first, with reference to FIG. 4, of a plasma deposition apparatus which is employed for the manufacture of the semiconductor device of the present invention. This apparatus is called an ECR (Electron Cyclotron Resonance) plasma deposition apparatus, and is disclosed in detail in "Plasma Deposition Apparatus" (Japanese Patent Application No. 57877/80) and "Low Temperature Plasma Deposition Apparauts" filed by the same assignee as the subject application. With this apparatus, a high density, high quality film can be deposited on a semiconductor substrate with good adhesion while holding the substrate at low temperatures. FIG. 4 is explanatory of the outline of the ECR plasma deposition apparatus. Reference numeral 21 indicates a plasma generating chamber; 22 designates a specimen chamber; and 23 identifies a microwave introduction window. As a microwave source, in this case, a magnetron of a 2.45 GHz frequency is used, and its microwave power is introduced through the microwave introduction window 23 into the plasma generating chamber 21 from a rectangular waveguide 24. The plasma generating chamber 21 is cooled by cooling water which flows from a feed port 25 to an exhaust port 25'. Two gas introduction systems are used; a first gas introduction system 26 is provided to introduce gas into the plasma generating chamber 21, and a second gas introduction system 27 is provided to introduce gas into the specimen chamber 22. An evacuation system 32 comprises, for instance, an oil diffusion pump and an oil rotary pump, which are not illustrated.

The plasma generating chamber 21 has, on the opposite side from the microwave intruduction window 23, a plasma extraction window 29 for extracting a plasma stream 28 from the plasma generating chamber 21. The shape and size of the plasma generating chamber 21 are determined so that it may act as a microwave cavity resonator. On the outside of the plasma generating chamber 21 are provided coils 33, and the intensity of the magnetic field yielded by the coils 33 is so selected as to satisfy the condition for electron cyclotron resonance by microwave (a magnetic flux density of 875 gausses) in the plasma generating chamber 21. Such an arrangement is made that the magnetic field generated by the coils 33 may extend to a specimen chamber 22, by which there is set up in the chamber 22 a divergent magnetic field the intensity of which diminishes at a proper gradient towards a specimen table 30.

With the ECR plasma deposition apparatus, plasma is generated, by using microwaves, in the plasma generating chamber 21 in a manner to develop electron cyclotron resonance, and the plasma is led along the divergent magnetic field from the plasma generating chamber 21 to the specimen chamber 22, wherein it is applied to a specimen 31 in an electrically floating state on the specimen table 30, thereby forming a desired film on the specimen 31. According to such a film deposition method (hereinafter referred to as an ECR plasma deposition process) employing the ECR plasma deposition apparatus, electrons in the plasma is continuously accelerated while continuing circular motion in the magnetic field and they become high-energy. And, by virture of the interaction between the magnetic moments of the high energy electrons themselves and the divergent magnetic field, the electrons flow along the divergent magnetic field to reach the specimen 31 to charge it negative, inducing an electrostatic field in the plasma stream between the plasma generating chamber 21 and the specimen table 30. The electrostatic magnetic field brings about an plasma acceleration state in which ions in the plasma stream are accelerated and the electrons are decelerated. The distribution of the electrostatic magnetic field is such that satisfies the neutralizing condition for feeding the electrons and ions at the same flow rate. This plasma acceleration is particularly remarkable under such an electron cyclotron resonance condition that electrons have large circular motion energy.

With the ECR plasma deposition process, the ions for the film deposition are obtained by directly generating plasma of a film material itself through using microwave under the condition that causes the electron cyclotron resonance; alternatively, the ions are obtained by generating plasma of an excitation gas (for example, argon) by using microwave under the electron cyclotron resonance condition first and then ionizing the film material by the resulting high energy electrons. In either case, the ions thus yielded are accelerated by the abovementioned plasma acceleration towards the specimen table 30 and bombards the specimen 31 substantially perpendicularly thereto. Consequently, the film deposited on the specimen 31 has directionality. That is to say, the film thus deposited is of high density in the direction of incidence of the ions, and substantially no film is deposited on the side wall of a surface step. The film, even if deposited on the side wall, is extremely low in density than on the planar surface portion, and is hardly resistant to etching.

Further more, in the ECR plasma deposition process, since the film deposition reaction is promoted by bombarding the specimen 31 with the ions subjected to the plasma acceleration, the film deposition can be achieved as at room temperature without the need for applying thermal energy to the specimen from the outside.

Now, a description will be given of how the film is deposited on the specimen. In the case of depositing an $Si_3N_4$ film, $N_2$ and $SiH_4$ gases are introduced into the first and second gas introduction systems 26 and 27, respectively, and the gas pressure in the specimen chamber 22 is set to the order of $10^{-4}$ Torr. In the case of an $SiO_2$ film, an $O_2$ gas is used in place of the $N_2$ gas. In the case of a silicon film, an inert gas such as argon is employed instead of the $N_2$ (or $O_2$) gas. For the film deposition of other materials, the abovesaid method can be employed if the film raw materials can be supplied in the form of gas. For instance, an aluminum film can be obtained by introducing argon into the first gas introduction system and, for example, $Al(CH_3)_3$ into the second gas introduction system.

With such an ECR plasma deposition technique, even if the substrate is held at as low a temperature as below 100° C., a very high quality film can be deposited with good adhesion over a large area (a 20 cm diameter region in an embodiment of the present invention).

Figure 5:
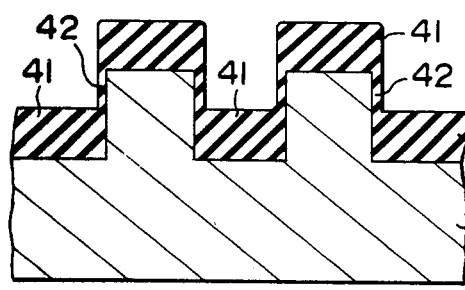
FIG. 5 is an explanatory sectional view of a deposited film obtained with the ECR plasma deposition apparatus.

The conditions required of the film deposition process in the case of utilizing the lift-off technique are not only that a high quality film of good adhesion be deposited at low temperatures, but also that the direction of growth of the film being deposited, that is, the direction of its deposition, be almost perpendicular to the substrate surface so as to facilitate subsequent stripping off of resist. From this point of view, the ECR plasma deposition process is fit for combination with the lift-off process in that the film is grown up in the direction perpendicular to the substrate surface because the raw material to be deposited is supplied mostly in the form of ions and bombard the substrate perpendicularly as described previously. In our experiments in which an $Si_3N_4$ film was deposited through the use of $N_2$ and $SiH_4$ gases, the thickness of a film 41 deposited on the upper surface of a pattern on a substrate 40 was more than four times as large as the thickness of a film 42 deposited on the side surface of the pattern as depicted in FIG. 5. This indicates that the film deposition by the ECR plasma deposition technique has the directionality which allows the use of the lift-off process.

Next, a description will be given of experimental results of an embodiment of the present invention which utilized the ECR plasma deposition process.

Figure 6:
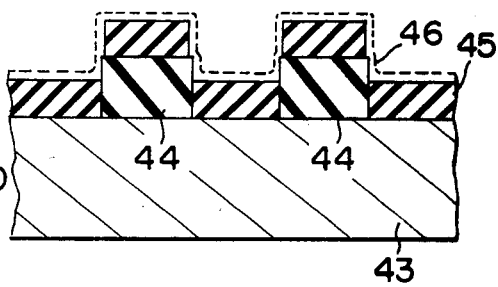
FIG. 6 is an explanatory view of an embodiment of the present invention.

As shown in FIG. 6, a PMMA film 44 was formed 0.8 μm thick as a resist film, a resist pattern is formed through utilization of deep UV lithography on a substrate 43 and then a 0.5 μm thick $Si_3N_4$ film 45 was formed as a film to be patterned, through using the ECR plasma deposition process. The conditions for this film deposition may be, for instance, a flow rate of 15 cc/min for $N_2$ (100%), a flow rate of 10 cc/min for $SiH_4$ (100%) and a 100 W microwave power. Thereafter, an $Si_3N_4$ film 46 (indicated by the broken line) about 0.1 μm thick, deposited on the side wall of the resist pattern, was removed by an isotropic etching process, such as cyindrical plasma etching using $CF_4$ gas or etching using a chemical liquid, such as fluoric acid, and then the PMMA film 44 and the $Si_3N_4$ 45 deposited thereon were lifted off through using acetone as a resist stripping solution. In this case, the isotropic etching process was effected before the lift-off process; however, since the $Si_3N_4$ film 46 on the side wall of the resist pattern is of low density, the acetone readily penetrates into the $Si_3N_4$ film 46 and the resist pattern can be lifted off even if the isotropic etching process does not take place. $Si_3N_4$ film patterns of a 1 μm line width could be obtained with high precision and with good yield.

FIGS. 7A to 7D are explanatory of the fabrication process of another embodiment of the present invention. At first, an aluminum film 48 was formed to a thickness of, for example, 0.6 μm, on a substrate 47 and coated with a resist film 49, after which the resist film 49 was patterned through utilization of UV lithography (see FIG. 7A). The aluminum film 48 on the substrate 47 was selectively etched away by a paralled plate plasma etching apparatus using $CCl_4$ gas, through employing the resist pattern 49 as a mask (see FIG. 7B). Next, an $SiO_2$ film 50 was deposited by the ECR plasma deposition process all over the surface of the substrate assembly with the resist pattern 49 remaining thereon, and then the resist pattern 49 and the overlying $SiO_2$ film 50 were lifted off (see FIGS. 7C and 7D). The $SiO_2$ film 50 was deposited by supplying each of $O_2$ (100%) and $SiH_4$ (100%) at a flow rate of 10 cc/min and using a 100 W microwave power under a reaction pressure of $2 \times 10^{-4}$ Torr. The film deposition rate was approximately 260 Å/min and the substrate temperature was 60° to 80° C. A higher film deposition rate, for example, 1000 Å/min can be obtained by increasing the flow rate of each of the $O_2$ and the $SiH_4$ to 30 cc/min, the microwave power to 200 W and the reaction pressure to $4 \times 10^{-4}$ Torr. The aluminum film 48 is vertically patterned by etching without being undercut (directional etching) and the subsequent deposition of the $SiO_2$ film has also directionality. Therefore, a rectangular-sectioned, gap-free, recessed pattern could be obtained.

Figure 7A:
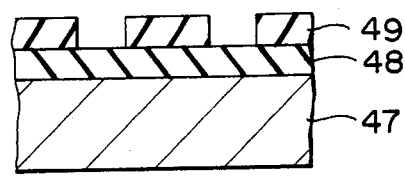
FIGS. 7A to 7D are explanatory view manufacturing steps in accordance with another embodiment of the present invention.
Figure 7B:
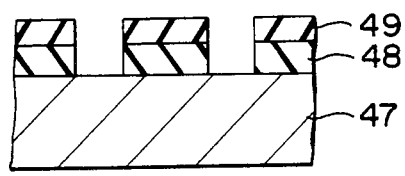
Figure 7C:
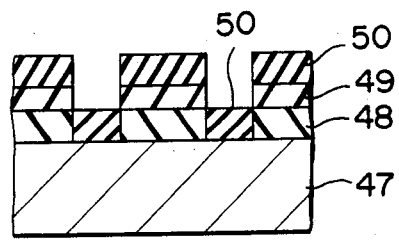
Figure 7D:
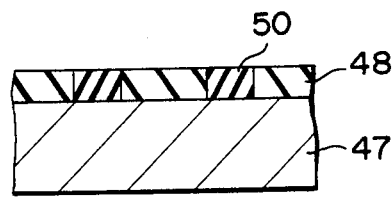

In this case, the $SiO_2$ film 50 was deposited 0.7 μm thick and removed about 0.1 μm (see FIG. 7C) and then lifted off by isotropic etching using $C_2F_6$ gas (see FIG. 7D). It has been found that since the $SiO_2$ film deposited on the side wall of the pattern is not subjected to ion bombardment during deposition, it has a little lowered density and is readily removable by plasma etching using the $C_2F_6$ gas. After the lift-off process there could be obtained an ideal recessed pattern which was 1 μm in line width, less than 0.05 μm in step height and rectangular in cross section and had a planarized surface. Incidentally, AZ 1350J was used for the resist film 49.

In the following description, what is meant by the words, for instance, "having no surface step" or "planarized" is that the step height between the surface of a first material layer, for example, an insulating layer and the surface of a second material adjacent to the first material layer, for example, a conductor layer or a semiconductor surface, is less than 30% of the thickness of the first material layer.

For the formation of the gap-free recessed pattern, the characteristic of the ECR plasma deposition process which allows the deposition of a small amount of $SiO_2$ on the pattern side wall, too, were effective.

The method described above can equally be applied to the delineation of a recessed metallization pattern with a planarized surface.

The pattern structure according to the embodiment of FIGS. 7A to 7D can also be employed as a conductive layer pattern in the following manner: Silicon (Si) doped with an impurity, such as boron (B), arsenic (As) or phosphorus (P), is recessed into, for instance, an $SiO_2$ film instead of the aluminum film 48, and then converted by heat treatment at 500° to 800° C., to polysilicon to make it conductive. The deposition of a silicon film doped with an impurity, by the ECR plasma deposition technique, can easily be achieved by supplying diborane ($B_2H_6$), arsine ($AsH_3$) and phosphine ($PH_3$) from the second (or first) gas introduction system at a fixed flow rate under the condition that, for example, silicon (Si) is formed.

Such an impurity-doped silicon film can also be utilized as an impurity diffusion source for controlling the electrical characteristics of a semiconductor.

As the resist material, use can be made of not only ordinary resist but also various materials which can be etched away and lifted off by the aforesaid lift-off technique, such as polyimide system resins, $SiO_2$, $Si_3N_4$ and other silicon compounds, $Al_2O_3$ and like metal oxides, and aluminum, chromium and other similar metals of relatively low melting point.

In the case of film deposition by the ECR plasma deposition process, adhesion and reliability of the deposited film can be improved by starting the film deposition with the introduction of $SiH_4$ or the like after generating plasma, through using only a gas which does not develop the deposition reaction, such as $N_2$, $O_2$, $A_2$ or the like, and then removing water and gas adsorbed on the surface of a specimen substrate.

Figure 8:
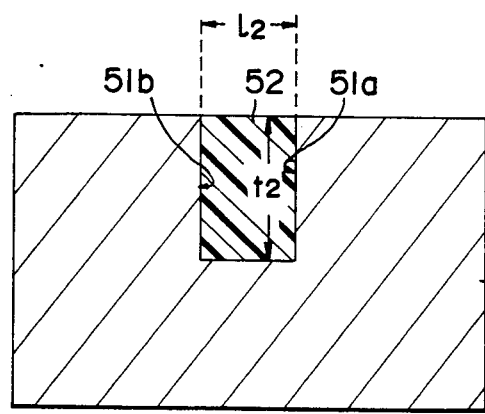
FIG. 8 is an explanatory view of a recessed insulating film in another embodiment of the present invention.

FIG. 8 illustrates, in cross section, another embodiment of the present invention. Reference numeral 51 indicates a silicon substrate; 51*a* and 51*b* designate inner walls of the silicon substrate 51; and 52 identifies an $SiO_2$ film. The silicon substrate 51 has a surface step defined by the steep walls 51*a* and 51*b*. But the surface planarity is achieved by depositing the thick $SiO_2$ film 52 in the groove defined by the walls 51*a* and 51*b*, through using the ECR plasma depostion process, and by the application of the lift-off process described previously in respect of FIGS. 7A to 7D. In other words, there is no surface step between the surface of the $SiO_2$ film 52 and the surface of the silicon substrate 51. As shown in FIG. 8, the $SiO_2$ film 52 is rectangular in cross section and its thickness (indicated by $t_2$) can be increased and its width (indicated by $t_1$) can be reduced. Therefore, this structure is suitable for miniaturization and high packing density. Accordingly, the $SiO_2$ film 52 can be used for field isolation. The $SiO_2$ film may also be replaced with other insulating films, for instance, an $Si_3N_4$ film.

Figure 1:
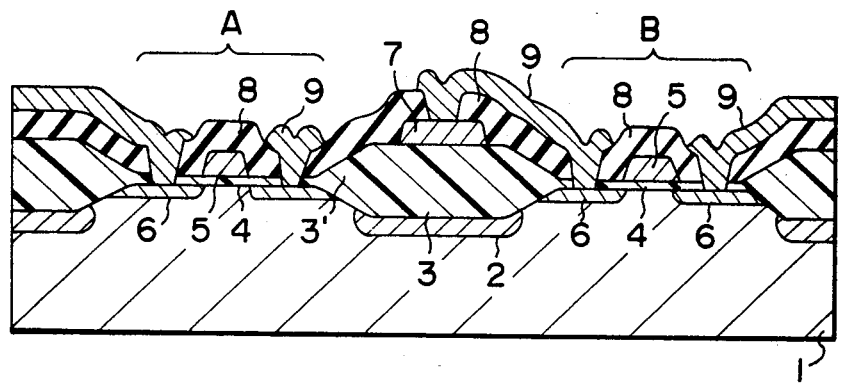
FIG. 1 is a cross-sectional view showing a portion of a conventional MOS LSI.
Figure 9:
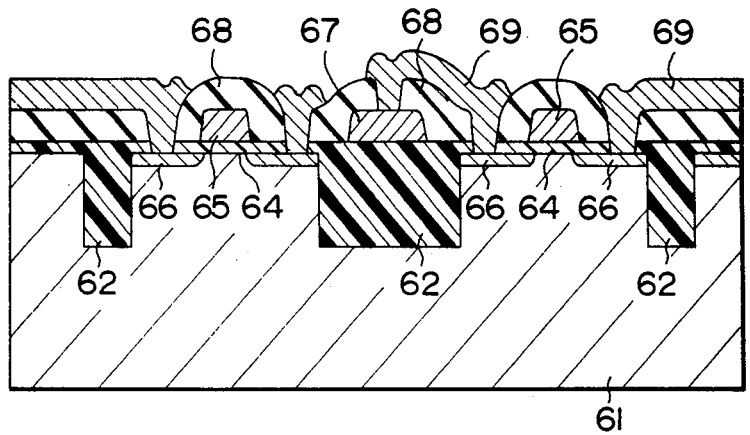
FIGS. 9, 10 and 11 are sectional views illustrating a portion of an integrated circuit embodying field isolation according to the present invention.

FIG. 9 is a cross-sectional view illustrating, by way of example, the principal part of an MOS integrated circuit embodying the field isolation structure described above with respect to FIG. 8. In FIG. 9, reference numeral 61 indicates a p type silicon substrate; 62 designates $SiO_2$ films for field isolation; 64 identifies gate insulating films; 65 denotes a gate electrodes; 66 shows n+ diffusion layers; 67 and 69 refer to conductors for interconnection; and 68 signifies insulating films. Because of the thick $SiO_2$ films 62 for field isolation having no surface steps, the surface step height of the structure shown in FIG. 9 is appreciably reduced as a whole, as compared with the surface step height in the prior art example of FIG. 1. The small surface step height not only facilitates the lithography process in the device fabrication but also reduces breakage of an interconnection line at the step. The rectangular cross section of each thick $SiO_2$ film 62 permits effective use of the active device area, achieving high packing density of the device. Moreover, the packing density can be further improved by coexistence of the $SiO_2$ films 62 of different widths in the same silicon substrate.

Figure 10:
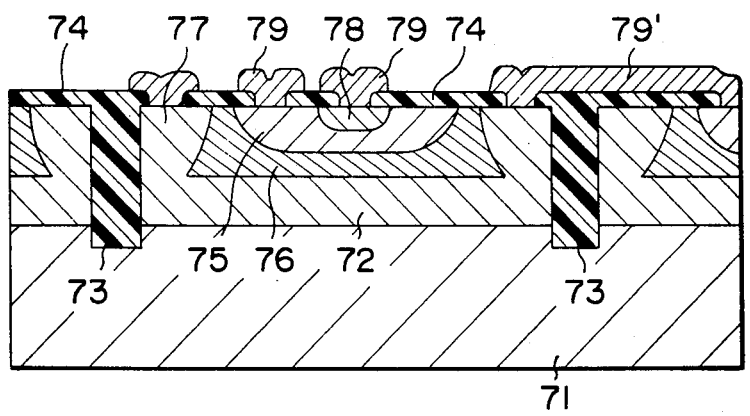

FIG. 10 shows, in cross section, another example of the field isolation structure of FIG. 8 as being applied to a bipolar integrated circuit. Reference numeral 71 indicates a p type silicon substrate; 72 designates an n+ diffusion layer called a buried diffusion layer; 73 identifies thick $SiO_2$ films for field isolation; 74 denotes a thin $SiO_2$ film; 75 represents a p type diffusion layer called a base region; 76 shows an n type diffution layer called a collector region; 77 refers to an n+ type diffusion layer; 78 signifies an n+ type diffusion layer called an emitter region; 79 indicates electrodes; and 79' designates an interconnection line. The thickness of $SiO_2$ films 73 are sufficiently large as compared with their width, and are formed to extend down into the p type silicon substrate 71. With such an arrangement, satisfactory field isolation characteristics can be achieved with a sufficiently fine pattern width as well as no surface steps are formed.

Figure 11:
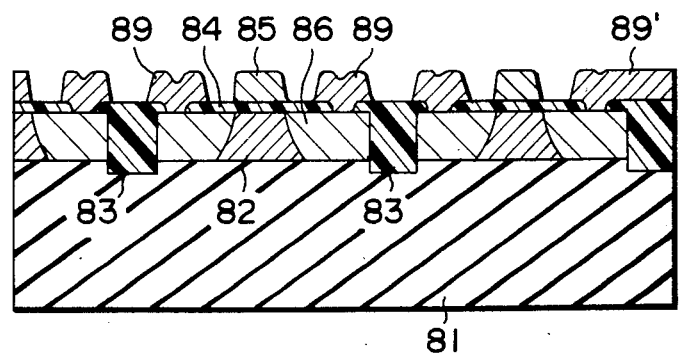

FIG. 11 illustrates, in cross section, another example of the structure of FIG. 8 as being applied to an SOS (Silicon On sapphire) substrate. Reference numeral 81 indicates a sapphire substrate; 82 designates p type silicon layers; 83 identifies thick $SiO_2$ films; 84 denotes gate insulating films; 85 represents gate electrodes; 86 shows n+ type diffusion layers; 89 referes to electrodes; and 89' an interconnection line. The transistors are each completely isolated electrically from adjacent ones of them because their sides and bottoms are surrounded by the $SiO_2$ films 82 and the sapphire substrate 81, respectively. This isolation structure has its features in that the surface is planar, and that the pattern width can be made fine.

Figure 12A:
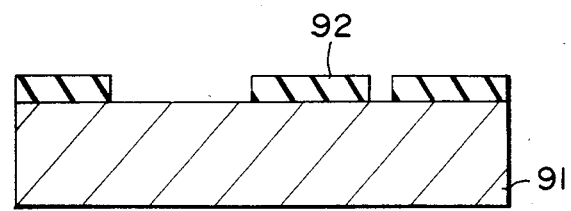
FIGS. 12A to 12D are explanatory views of a sequence of steps involved in the fabrication of a field isolation structure according to the present invention.
Figure 12B:
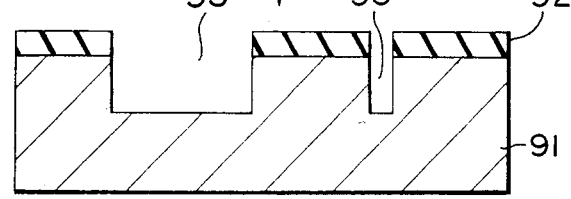
Figure 12C:
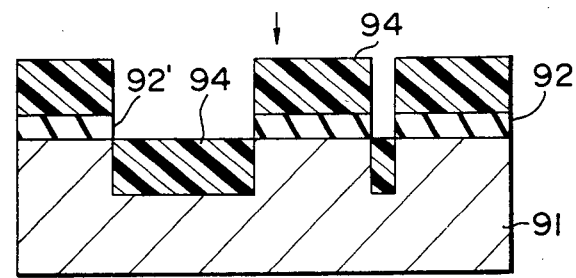
Figure 12D:
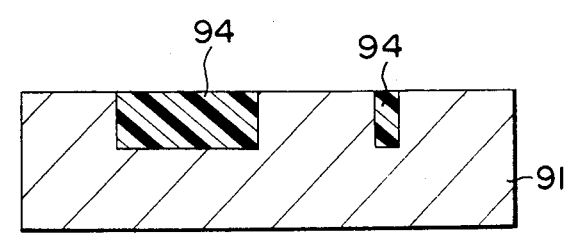

FIGS. 12A to 12D illustrate, in cross section, an example of a sequence of steps for producing the structure depicted in FIG. 8. In FIG. 12A, reference numeral 91 indicates a silicon substrate; and 92 designates a resist (as of AZ 1350 by SHIPLEY in U.S.A.) pattern. The silicon substrate 91 is selectively etched away through the resist pattern 92 serving as a mask, by a dry etching apparatus with a parallel plate electrode, forming etched grooves 93 to a desired depth as shown in FIG. 12B. It must be noted here that the etching of the substrate is not accompanied by undercutting, ensuring that the etched grooves 93 become rectangular in cross section. Next, an SiO₂ film 94 is deposited by carrying out the ECR plasma deposition process under such conditions as mentioned previously, to fill up the grooves 93, providing a structure depicted in FIG. 12C. In this case, since the SiO₂ film 94 can be deposited at low temperatures (below 100° C.), the resist pattern 94 is neither deformed nor degenerated. Further, the film deposition has directionality, and consequently the SiO₂ film 94 is not deposited on the side walls 92' of the resist pattern. After the film deposition, the resist pattern 92 is removed using a resist stripping solution (for example, a mixture of sulfuric acid and hydrogen peroxide solution, J-100 or acetone), by which can be obtained a structure which has recessed thereinto the SiO₂ films 94 and has a planar surface as shown in FIG. 12D.

With the abovesaid fabrication process, it is possible to form plural kinds of SiO₂ films of different widths in the same substrate. Moreover, since the dry etching and the plasma deposition both have appreciable directionality, the pattern undergoes little change; therefore, this fabrication process is suitable for microfabrication of semiconductor integrated circuits.

In FIG. 12A, the resist pattern 92 is formed directly on the silicon substrate 91, but it is needless to say that an SiO₂ or Si₃N₄ film can be interposed between the resist pattern 92 and the silicon substrate 91. In this case, the structure of FIG. 12D can be obtained by etching away the interposed SiO₂ or Si₃N₄ film after removing the resist pattern 92. Also it is a matter of course that, in FIG. 12B, an impurity such as boron may be introduced into the exposed surface of the silicon substrate at the bottom of the etched groove after the formation thereof.

The SiO₂ or Si₃N₄ film deposited by the ECR plasma deposition process has an extremely small number of pin holes and is excellent in stoichiometry, and hence it is suitable for use as a semiconductor material. The etching rate of the SiO₂ film formed by the ECR plasma deposition process is substantially equal to the etching rate of an SiO₂ film formed by the usual thermal oxidation technique. The Si₃N₄ film by the abovesaid process has a small hydrogen content and its etching rate is almost equal to that of an SiO₄ film by the ordinary CVD technique.

In the fabrication process depicted in FIGS. 12A through 12D, the depth of the etched groove 93 and the thickness of the SiO₂ film 94 deposited therein are selected equal to thereby achieve surface planarity. In actual device fabrication, however, the deposition of the SiO₂ film may sometimes be followed by a cleaning or etching process, which may diminish a little the film thickness. Accordingly, in anticipation of such a decrease in the film thickness, the SiO₂ film 94 may be deposited a little thicker.

Figure 2:
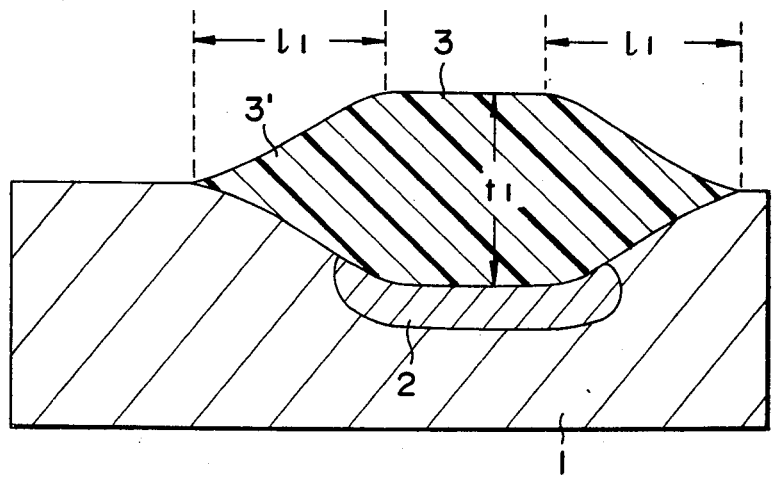
FIGS. 2 and 3 are explanatory views showing problems posed by the conventional selective oxidation technique.
Figure 3:
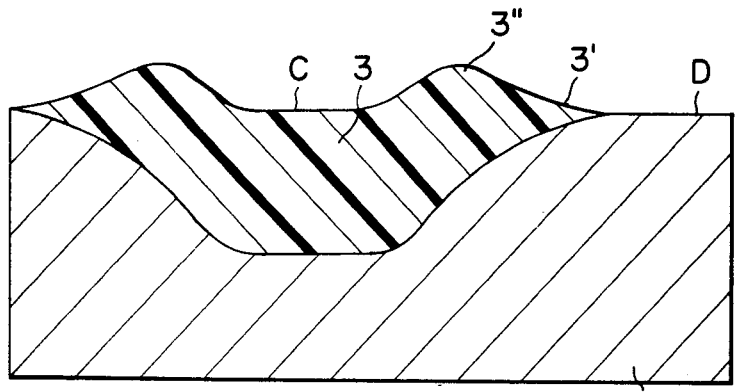

Needless to say, a p type diffusion layer may be provided in the silicon substrates 51 and 61 underlying the recessed SiO₂ films 52 and 62 in FIGS. 8 and 9. This n type diffusion layer serves to prevent the occurrence of a parasitic channel as is the case with the p type diffusion layer 2 formed under the selective oxide film 3 in FIGS. 1 and 2. In the case of employing an n type silicon substrate, the p type diffusion layer has to be replaced with an n type diffusion layer.

In the foregoing, the recessed SiO₂ films 52, 62, 73, 83 and 94 can be replaced with other insulating films, for instance, an Si₃N₄ film, an insulating film (Si$_x$O$_y$N$_z$) of a composition intermediate between the SiO₂ and Si₃N₄ films, or an SiO₂ film doped with an impurity such as phosphorus, boron or the like. These insulating films can be formed by the ECR plasma deposition apparatus. Furthermore, the p type silicon substrate in the foregoing may be replaced with an n type silicon substrate or compound semiconductor substrate as of GaAs or the like.

Figure 13:
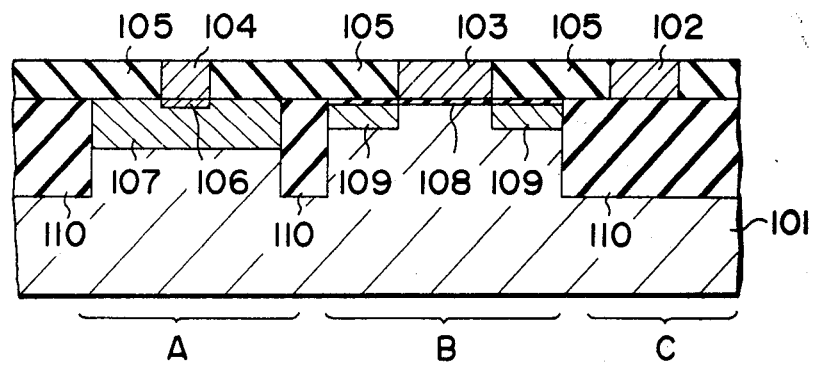
FIG. 13 is a cross-sectional view of a structure having its surface planarized according to the present invention.

FIG. 13 is a cross sectional view illustrating another embodiment of the present invention. Reference numeral 101 indicates a semiconductor substrate; 102, 103 and 104 designate silicon layers, for instance, polysilicon layers; 105 identifies Si₃N₄ films; 110 denotes thick SiO₂ films; 106, 107 and 109 represent diffusion layers; and 108 represents a gate oxide film. The Si₃N₄ films 105 are recessed into the polysilicon layers 102, 103 and 104; therefore, this structure has no surface step height. As depicted in FIG. 13, the Si₃N₄ films 105 and the polysilicon layers 102, 103 and 104 are rectangular in cross section and they can be formed thick and narrow. Accordingly, this structure is suitable for microfabrication of semiconductor integrated circuits with high packing density.

In FIG. 13, a portion A indicates the application of the present invention to a bipolar integrated circuit. The silicon layer, for instance, the polysilicon layer 104 is in direct contact with the silicon substrate 101 (the diffusion layer 106), and the diffusion layer 106 has the same pattern as the polysilicon 104.

A portion B indicates the application of the present invention to an MOS integrated circuit. The polysilicon 103 is disposed on the silicon substrate 101 with the gate oxide film 108 interposed therebetween. The diffusion layers 109 are formed in the surface of the silicon substrate 101 in close proximity to the polysilicon layer 103.

A portion C shows an example in which the polysilicon layer 102 is used as an interconnection line.

Figure 14:
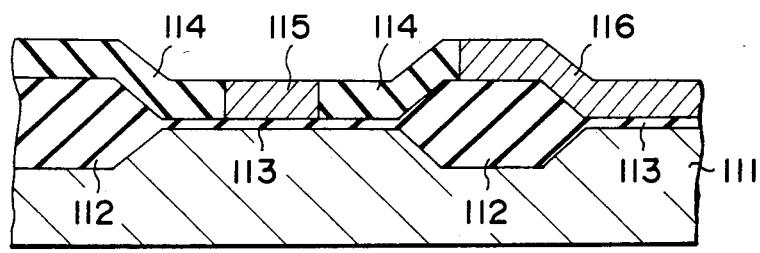
FIGS. 14 and 15 are explanatory views of the case where the substrate has a surface step.
Figure 15:
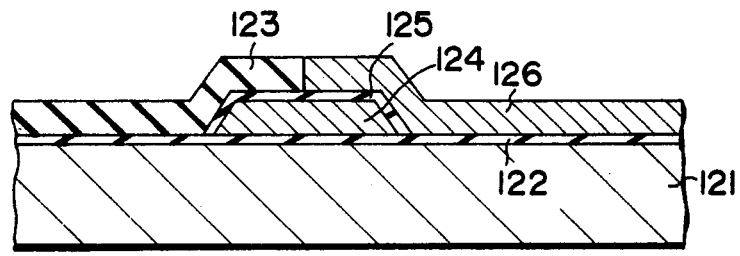

FIGS. 14 and 15 illustrate, in cross section, other embodiments of the present invention, each of which the layer to be deposited upon has surface steps (irregularities in surface). FIG. 14 shows an embodiment of the present invention as being applied to a silicon substrate subjected to field isolation by the selective oxidation technique. Reference numeral 111 indicates a silicon substrate; 115 and 116 designate silicon layers, for instance, polysilicon layers; 114 identifies Si₃N₄ films; 112 denotes thick SiO₂ films formed by the selective oxidation technique; and 113 represents gate oxide films. The Si₃N₄ films 114 are recessed adjacent the polysilicon layers 115 and 116, and the surfaces of the Si₃N₄ film 114 and the polysilicon layers 115 and 116 conform directly to the irregularities of the surface of the underlying layer; however, the surface step height is scarecely increased by the Si₃N₄ film 114 and the polycilicon layers 115 and 116. As shown in FIG. 14, the Si₃N₄ film 114 and the polysilicon layers are rectangular in cross section, and hence they can be increased in thickness and reduced in width; therefore, this embodiment is suitable for a miniaturized structure with high packing density.

FIG. 15 illustrates, in cross section, another embodiment of the present invention in which a gate electrode of an MOS integrated circuit is formed by two polysilicon layers. Reference numeral 121 indicates a silicon substrate; 124 designates a first polysilicon layer; 126 identifies a second polysilicon layer; 123 denotes an Si₃N₄ film; 122 represents a gate oxide film; and 125 shows an SiO₂ film for electrically insulating the first and second polysilicon layers 124 and 126. The first polysilicon layer 124 is formed by a known technique and is coated over its surface with the SiO₂ film 125, on which the structure of the present invention is formed. The Si₃N₄ film 123 is recessed adjacent the second polysilicon layer 126, and the formation of the Si₃N₄ film 123 and the polysilicon layer 126 scarecely increases the surface step height (irregularities). As shown in FIG. 15, the Si₃N₄ film 123 and the polysilicon layer 126 are rectangular in cross section, and hence they can be increased in thickness and reduced in width; therefore, this embodiment is suited for a miniaturized structure with high packing density.

The structure of the present invention would still exhibit the aforementioned advantages even if a refractory metal or refractory metal silicide should be used in place of the polysilicon employed in the above-described embodiments. Also, the Si₃N₄ film recessed into the polysilicon can be replaced with other insulating films as of an insulating material ($Si_xO_yN_z$) having a composition intermediate between the SiO₂ film and the Si₃N₄ film. Although in the foregoing the structure of the present invention has been described as being applied in the form of a single layer, it is a matter of course that the structure of the present invention can be applied in the form of a multilayer.

Figure 16A:
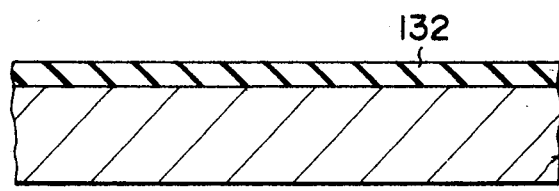
FIGS. 16A to 16D show, by way of example, steps involved in the fabrication of a portion A in FIG. 13.
Figure 16B:
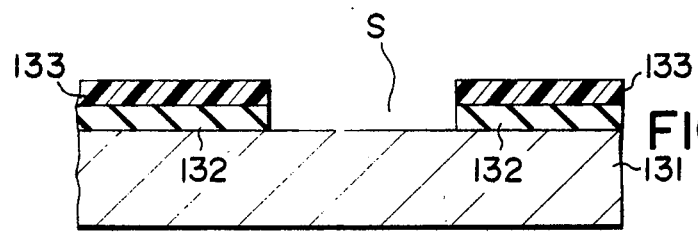
Figure 16C:
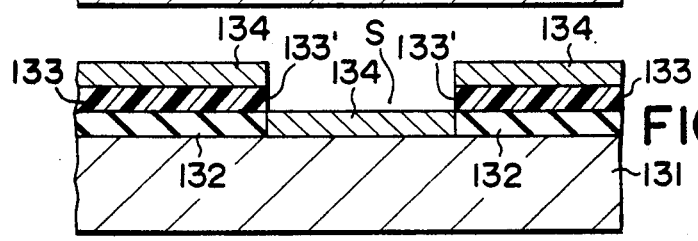
Figure 16D:
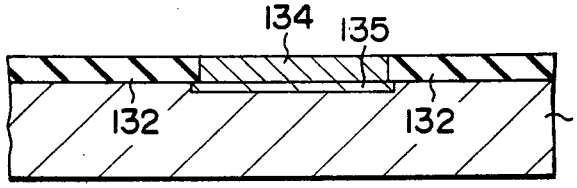
Figure 18A:
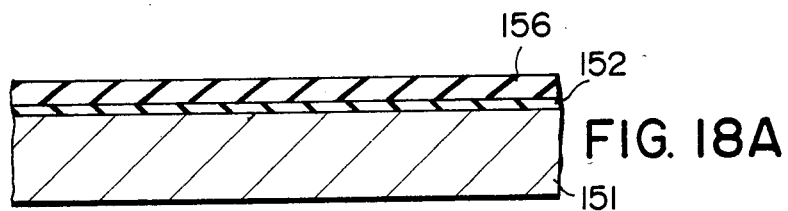
FIGS. 18A to 18D are explanatory views of fabrication steps similar to those shown in FIGS. 17A to 17D.
Figure 18B:
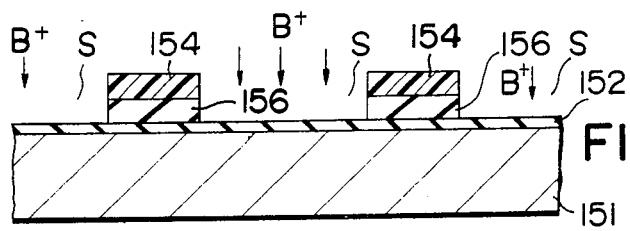
Figure 18C:
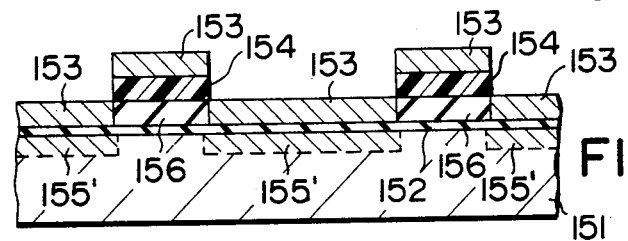
Figure 18D:
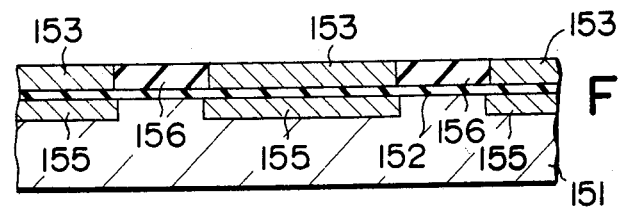

FIGS. 16A through 16D illustrate, by way of example, a fabrication process for obtaining the structure of the portion A in FIG. 13. The fabrication starts with the preparation of a silicon substrate 131, on which is formed an Si₃N₄ film 132 by the thermal decomposition process as shown in FIG. 16A. Next, a resist (for example, AZ1350 by Shipley in USA) 133 is selectively removed into a predetermined pattern as depicted in FIG. 16B. The Si₃N₄ film 132 is selectively etched away, through using the resist pattern 133 as a mask, by a dry etching apparatus having a parallel plate electrode, providing a desired pattern as shown in FIG. 16B. It must be noted here that undercutting is caused by the etching, ensuring to form a rectangularsectioned etched groove S. Next, a silicon layer, for instance, a polysilicon layer 134 is deposited through the use of the ECR plasma deposition apparatus to fill up the etched groove S, obtaining a structure shown in FIG. 16C. The deposition of the silicon layer 134 is carried out by supplying, for example, Ar (100%) and SiH₄ (100%) at a flow rate of 10 cc/min and using a microwave power of 100 W under a pressure of $2 \times 10^{-4}$ Torr. The deposition rate in this case is about 200 Å/min. It must be noted here that since the polysilicon layer 134 can be deposited at low temperatures (below 100° C.), the resist pattern 133 is neither deformed nor degenerated, and that since the deposition phenomenon has directionality, the polysilicon layer 134 is scarcely formed on a side wall 133' of the resist pattern 133. Next, the resist pattern 133 is removed by a resist stripping solution (for instance, a mixture of sulfuric acid and hydrogen peroxide solution, J-100 or acetone), obtaining such a structure as shown in FIG. 16D. Next, an impurity impregnated into the polysilicon layer 134 is thermally diffused to form a impurity diffusion layer 135 in the surface of the silicon substrate 131. In the case where the polysilicon layer 135 is not impregnated with the impurity in this process, an impurity is diffused as by the thermal diffusion technique into the polysilicon layer 134 first and then is diffused into the surface of the silicon substrate 131, thus forming the diffusion layer 135. The diffusion layer 135 can also be formed by the ion implantation method after obtaining the structure shown in FIG. 16C.

FIGS. 17A through 17D illustrate, by way of example, a fabrication process for obtaining the structure of the portion B in FIG. 13. The fabrication starts with the preparation of a silicon substrate 141, on which is formed by the thermal oxidation method a gate oxide film 142, which is covered with a polysilicon layer 143 by the thermal decomposition method as depicted in FIG. 17A. Next, a resist film 144 is patterned as shown in FIG. 17B. The polysilicon layer 143 is selectively etched away, through using the resist pattern 144 as a mask, by the dry etching apparatus provide with a parallel plate electrode, obtaining such a desired pattern as shown in FIG. 17B. It must be noted here that no undercutting is caused by the etching, ensuring to provide rectanglar-sectioned etched grooves S. Next, impurity ions are implanted by the ion implantation into the substrate surface through the etched grooves S, using the resist pattern 144 and the polysilicon layer 143 as a mask. Reference numeral 145' indicates ion implanted regions. Next, an Si₃N₄ film (or an insulating film such as an SiO₂ film) is deposited by the ECR plasma deposition apparatus under such conditions as mentioned previously, filing up the etched grooves S as shown in FIG. 17C. Also in this case, it must be noted that since the deposition of the Si₃N₄ film 146 can be effected at low temperatures (below 100° C.), the resist pattern 144 is neither deformed nor degenerated, and that since the deposition phenomenon has directionality, substantially no Si₃N₄ film is deposited on the side walls 144' of the resist pattern 144. Next, the resist pattern 144 is removed by the resist stripping solution (for instance, a mixture of sulfuric acid and hydrogen peroxide solution, J-100 or acetone), obtaining a structure with a planar surface depicted in FIG. 17D. Next, the substrate assembly is subjected to high heat treatment (at 1000° C. for about 30 minutes), by which the ions implanted in the previous process are activated to form diffusion layers 145.

The manufacturing steps shown in FIGS. 18A to 18D are substantially identical with those of FIGS. 17A to 17D, and the materials used are also the same. The same unit digits of reference numerals 151 to 156 indicate the same materials. The embodiments differ in that the Si₃N₄ film 146 is recessed in FIGS. 17A to 17D, whereas, in FIGS. 18A to 18D, a polysilicon layer 153 is recessed into an Si₃N₄ film 156. As a result of this, a diffusion layer 155 is formed in the surface of a silicon substrate 151 just under the polysilicon layer 153. In the case where the techniques shown in FIGS. 17A to 17D and 18A to 18D is applied to an MOS integrated circuit, the diffusion layers 145 in FIGS. 17A to 17D can be used as the source and drain of an MOS transistor, and the diffusion layer 155 in FIGS. 18A to 18D can be employed as an impurity concentration control layer (channel dope layer) of the channel of the MOS transistor.

According to the embodiment of FIGS. 18A to 18D, unlike the method of obtaining a planarized structure by selective oxidation of polysilicon, planarity is achieved by recessing an insulating or conductor layer into a conductor or insulating layer. In this method, it is possible to use, inplace of the polysilicon, other conductive materials which can withstand the diffusing temperature in the subsequent process, such as a refractory methal, a refractory metal silicide and so forth. The resist patterns 144 and 154 may similarly be formed of an organic material, a silicon compound, a metal oxide and so forth.

Figure 19:
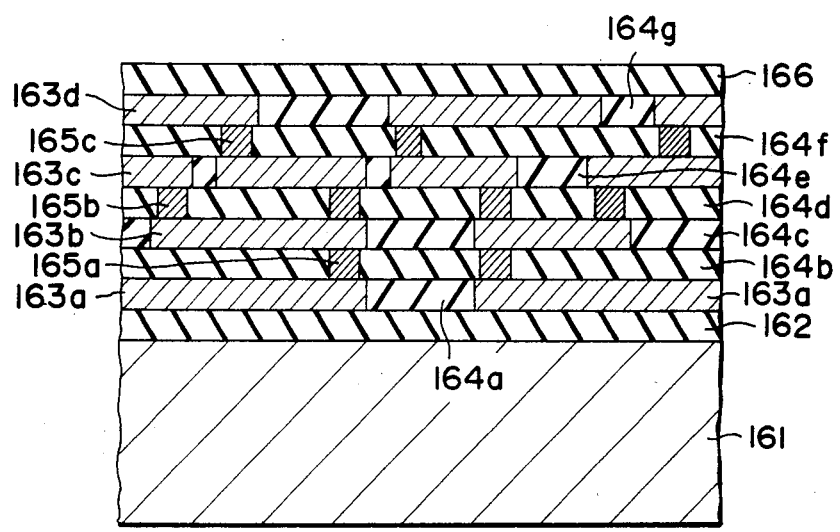
FIG. 19 is a cross-sectional view of another embodiment of the present invention which employs a multilevel interconnection structure.

FIG. 19 is a cross section illustrating a multilevel interconnect structure fabricated by an embodiment of this invention method shown in FIGS. 20A through 20H, 21A through 21D, 22A through 22D and 23. Reference numeral 161 indicates a silicon substrate; 162 designates an insulating film such as a thermal oxidation film or a CVD film; 163a to 163d identify conductor layers of aluminum, molybdenum, tungsten and the like; 164a to 164g denote insulating film such as Si$_3$N$_4$ films, SiO$_2$ film and so forth; 165a to 165c represent conductor layers of aluminum, molybdenum, tungsten and the like; 166 shows a final passivation film; and 167a to 167b refer to resist films.

Figure 20A:
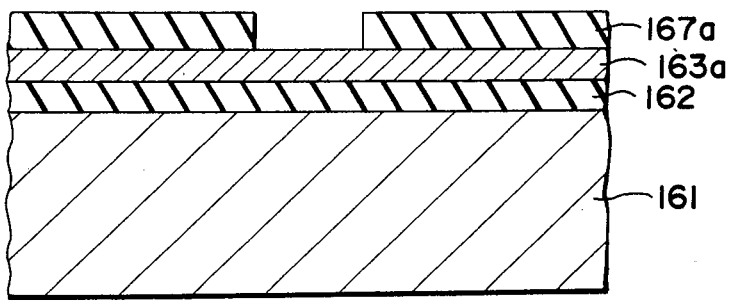
Figure 20B:
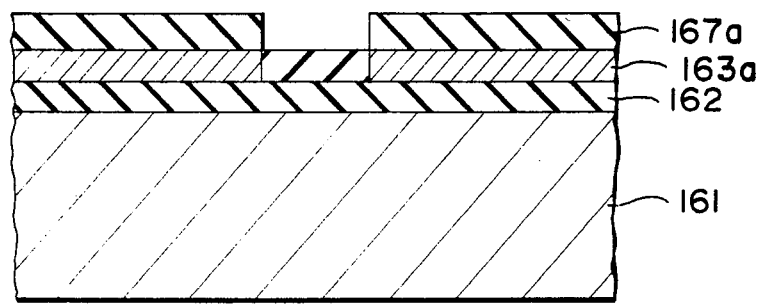

At first, as shown in FIG. 20A, the insulating film 162 such as a thermal oxidation film is formed on the silicon substarate 161, and the conductor layer 163a as of aluminum is deposited on the insulating film 162. Then, a resist pattern of the resist film 167 is formed on the conductor layer 163a, and the conductot layer 163 is selectively etched away, through using the resist pattern as a mask. This etching is carried out by a reactive ion etching which is capable of microfabrication without side etching or undercutting so that the side surfaces of the conductor layer 163a may be vertical as shown in FIG. 20B.

Figure 20C:
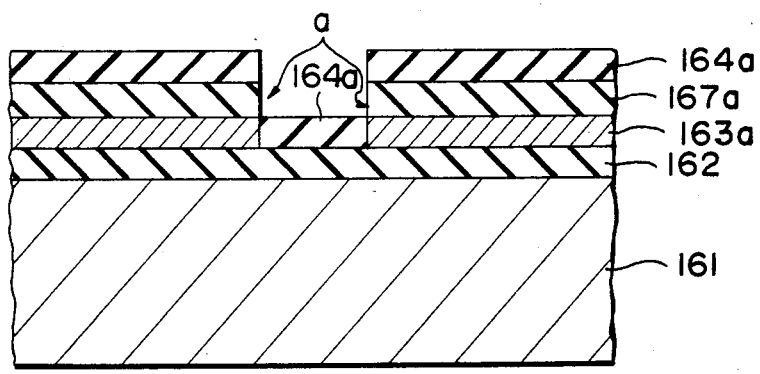

Next, as shown in FIG. 20C, the insulating film 164a such as an Si$_3$N$_4$ film or the like is deposited on the resist film 167a and the exposed surface of the insulating film 162 to the same thickness as the conductor layer 163a through using the ECR plasma deposition technique under such conditions as mentioned previously. With the ECR plasma deposition technique, since a film of a conductor or insulating material can be deposited with directionality in the direction perpendicular to the specimen surface, substantially no film is deposited on the side walls (indicated by the arrows a) of the resist film 167a unlike in the case of the ion beam sputter technique. Furthermore, since a deposited film of small internal stress can be formed at room temperature, the ECR plasma deposition technique possesses the advantage that no warping or cracking of the silicon substrate 161 is caused. Moreover, the ECR plasma deposition technique can be used for the deposition of a variety of films such as Si$_3$N$_4$, SiO$_2$, silicon, molybdenum conductor, semiconductor and insulating films, and is capable of forming thin films which are excellent in terms of refraction index, density and pin hole.

Figure 20D:
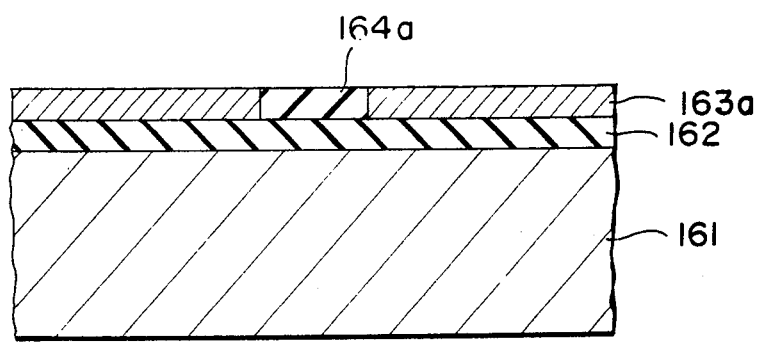

Next, the substrate assembly is subjected to ultrasonin rinsing in acetone or heated J-100 to remove the resist film 167a, lifting off the insulating film 164a. As a result of this, such a multilevel interconnection structure as shown in FIG. 20D can be obtained which comprises the conductor layer 163a and the insulating film 164a and has a planar upper surface.

Figure 20E:
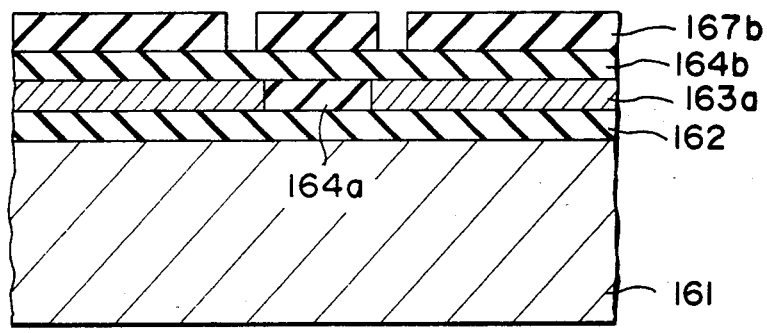

Next, the insulating film 164b is formed on the interconnection layer made up of the conductor layer 163a and the insulating film 164a, and the resist film 167b is formed on the insulating film 164b except at those areas where through hole will be formed as shown in FIG. 20E.

Figure 20F:
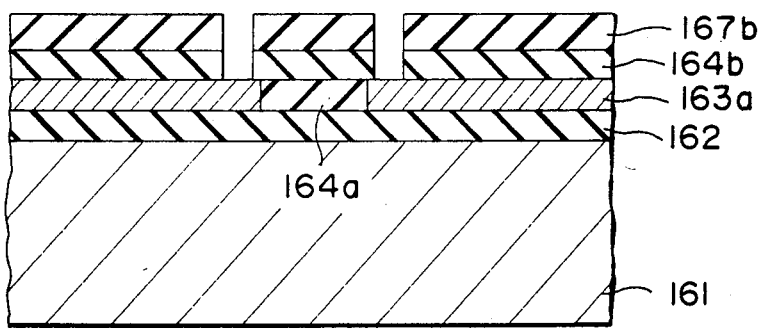

Next, the insulating film 164b is selectively etched away by the aforementioned reactive ion etching technique through the resist film 167b used as a mask, obtaining a structure shown in FIG. 20F.

Figure 20G:
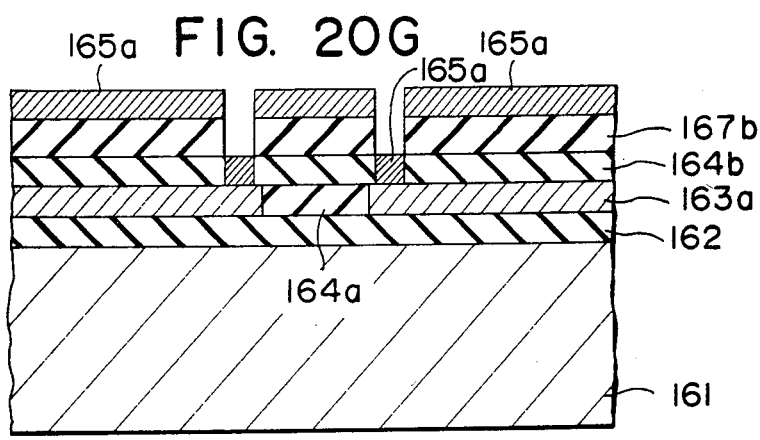

Next, the conductor layer 165a as of aluminum is deposited by the ECR plasma deposition technique to the same thickness as the insulating film 164b, obtaining a structure depicted in FIG. 20G.

Figure 20H:
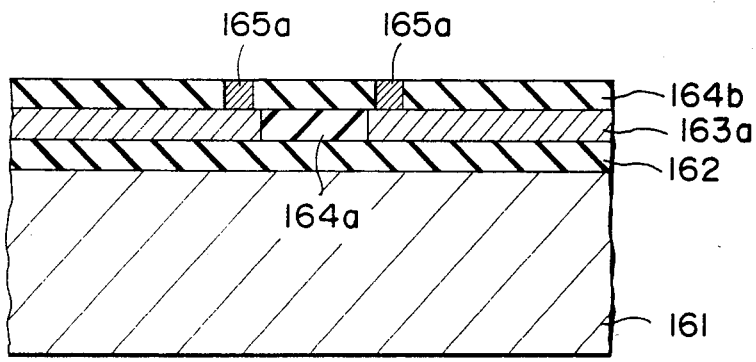

Next, the conductor layer 165a deposited on the resist film 167b is lifted off by the same method as described previously, obtaining a structure with a planar surface as depicted in FIG. 20H.

Thereafter, the conductor layers 163b to 163d, 165b and 165c and the insulating film 164c to 164g are similarly formed and, finally, the final passivation film 166 is formed, obtaining the multilevel interconnect structure illustrated in FIG. 19.

As described above, according to this embodiment, the multilevel interconnect structure is obtained by repeating the steps of selectively etching away the conductor layer 163a and the insulating layer 164b through the resist films 167a and 167b serving as masks, depositing the insulating film 164a by the ECR plasma deposition technique to the same thickness as the conductor layer 163a, depositing the conductor layer 165a by the ECR plasma deposition technique to the same thickness as the insulating film 164b, and stripping off the resist films 167a and 167b to thereby lift off the insulating film 164a and the conductor layer 165a formed thereon. Since the ECR plasma deposition tebhnique is capable of forming a deposited film of little internal stress at room temperature as referred to previously, there is no possibility of the silicon substate 161 being warped or cracked by the film deposition; therefore, the surface of each interconnect layer can be planarized (which means that the surface step height between the insulating film and the conductor layer can be reduced down to less than 30% of their thicknesses). In addition, since the ECR plasma deposition technique ensures the depostion of the film with directionality, substantially no deposited film is formed on the side walls of the resist films 167a and 167b, allowing ease in the lift-off process.

And the planarization of the surface of each interconnect layer produces the following effects:

Vertical dimensions of an LSI can be freely be selected and by selecting the vertical dimensions large, the wiring resistance and parasitic capacitance can be reduced, providing for increased operating speed of the LSI. Moreover, the planar surface of each interconnect layer eliminates the possibility of breakage or shorting of the interconnection lines which were apt to occur in the surface step regions in the prior art, and consequently the yield rate of device fabrication and the reliability of devices can be improved. Furthermore, the planar surface of each layer permits the application of the same pattern rule to all the layers, and hence is advantageous for high packing density and facilitates the design of wiring. In addition, the multilayer structure can easily be obtained by silmply repeating the same fabrication process. Besides, in the case of the structure of FIG. 19, the effect of planarization can further be heightened by using, in combination with the manufacuring steps described above, a step in which the conductor interconnect layer is formed of a refractory metal such as molybdenum silicide or tungten silicide, a PSG film or low-melting-point glass layer is deposited on the conductor interconnect layer and then glass flow is effected.

Although in the foregoing embodiments insulating materials (the insulating films 164a, 164c, 164e and 164g)are recessed into interconnection line layers (the conductor layers 165a to 165c) are recessed into the through holes, they may also be formed in the reverse order.

FIGS. 21A to 21D illustrate, in cross section, another embodiment of the present invention, which is desighed so that the lift-off process can be carried out more easily. In FIGS. 21A to 21D, reference numeral 168 indicates a spacer formed as by a silicon deposited film; 169 designates a resist film; and 170 identifies an insulating film. The same reference numerals as those in FIG. 19 indicate the same portions.

Figure 21A:
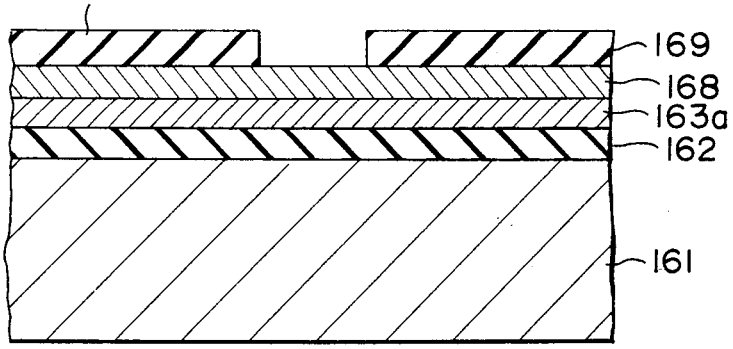

At first, as shown in FIG. 21A, the insulating film 162 and the conductor layer 163a are formed on the silicon substrate 161. Then, a silicon layer is deposited by performing the ECR plasma deposition process under such conditions as mentioned previously, on the conductor layer 163a to form the spacer 168. Next, a resist pattern by the resist film 169 is formed on the spacer 168.

Figure 21B:
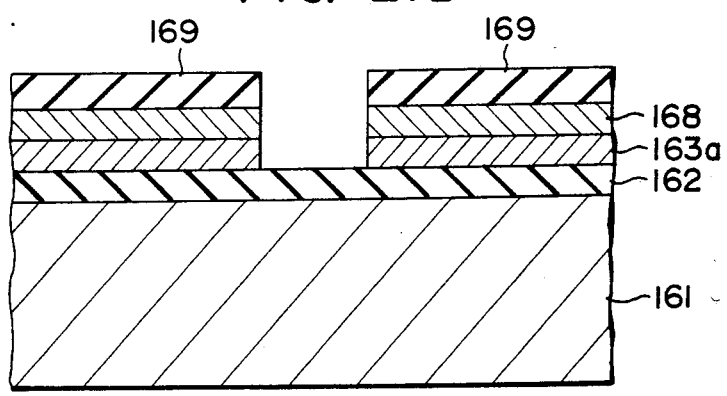

Next, the spacer 168 and the conductor layer 163a are selectively etched away by the reactive ion etching through the resist film 169 used as a mask, obtaining a structure shown in FIG. 21B.

Figure 21C:
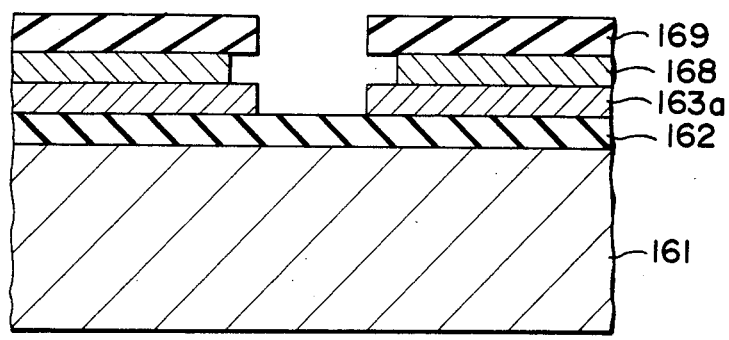

Next, the spacer 168 is etched by isotropic etching as depicted in FIG. 21C.

Figure 21D:
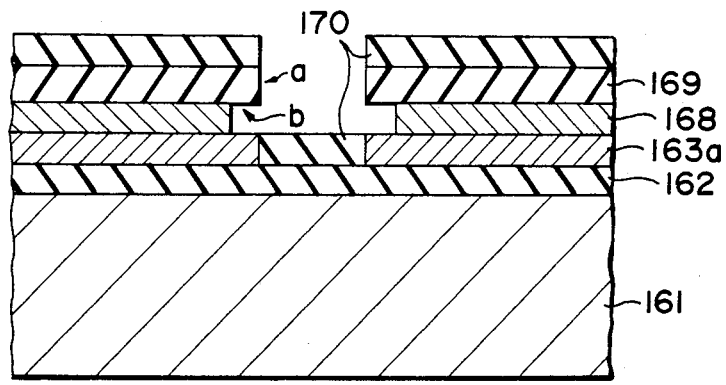

Next, the insulating film 170 such as an $Si_3N_4$ or $SiO_2$ film is deposited by the ECR plasma deposition technique to the same thickness as the conductor layer 163a as shown in FIG. 21D. The structure depicted in FIG. 21D is complex in its manufacturing process as compared with the structure of FIG. 20C, but the lift-off process can easily be carried out because the area of the resist film exposed when to lift off (indicated by arrows a and b in FIG. 21D) is larger than in the case of FIG. 20C.

FIGS. 22A through 22D illustrate, in cross section, another embodiment of the present invention, which is designed so that the lift-off process may be easily effected through the use of two resist films 171a and 171b. In FIGS. 22A to 22D, reference numerals 171a and 171b indicate resist films; 172 designates a deposited layer of $SiO_2$ or $Si_3N_4$; and 173 identifies an insulating film. The resist films 171a and 171b are about 2 to 3 $\mu m$ and 0.5 $\mu m$, respectively, and the deposited layer 172 is about 0.2 $\mu m$.

Figure 22A:
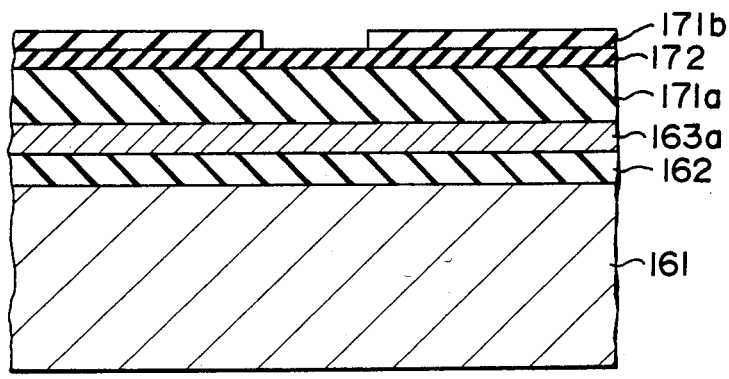
Figure 22B:
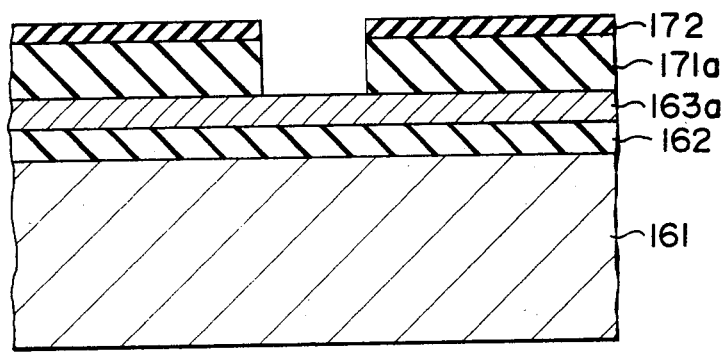

The fabrication process starts with the formation of the insulating film 162, the conductor layer 163a the resist film 171a, the deposited layer 172 and the resist film 171b on the silicon substrate 161 as shown in FIG. 22A. Next, the deposited layer 172 is selectively etched away by the reactive ion etching technique through using the resist film 171b as a mask, as depicted in FIG. 22B.

Figure 22C:
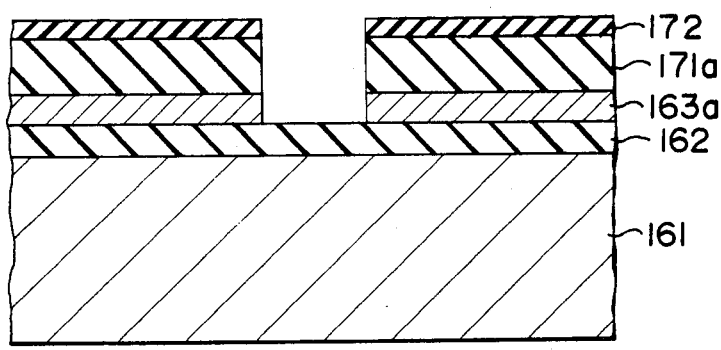

Next, the conductor layer 163a is selectively etched away by the reactive ion etching through using the deposited layer 172 and the resist film 171a as a mask, as illustrated in FIG. 22C.

Figure 22D:
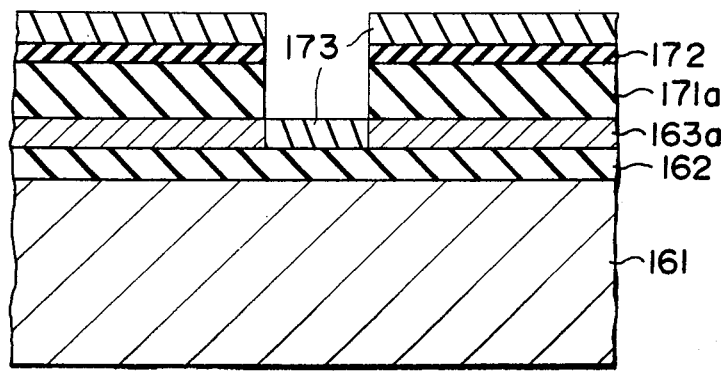

Next, the insulating film 172 such as an $Si_3N_4$ or $SiO_2$ film is deposited by the ECR plasma deposition process to the same thickness as the conductor layer 163a as shown in FIG. 22D. As is the case with the structure of FIG. 21D, the structure of FIG. 22D is also complex in its manufacturing process as compared with the structure of FIG. 20C, but the lift-off process can easily be effected because the area of the resist film 171a is large when it is lifted off.

Figure 23:
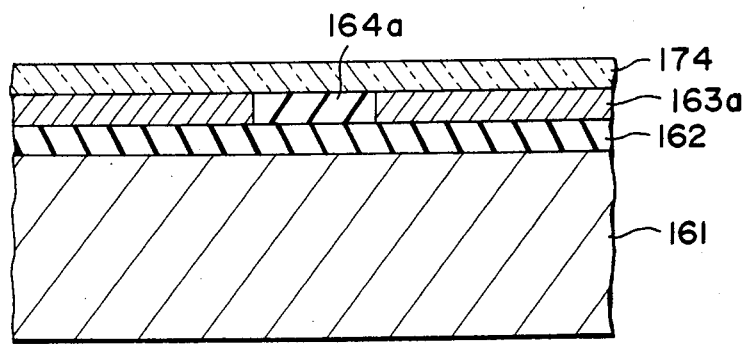
FIGS. 20A to 20H, 21A to 21D, 22A to 22D and 23 are explanatory views of different steps involved in the manufacture of the structure depicted in FIG. 19.

FIG. 23 illustrates, in cross section, another embodiment of the present invention, which is intended for further planarization. In FIG. 23, reference numeral 174 indicates a deposited layer of PSG, low-melting-point glass or the like. The parts corresponding to those in FIG. 19 are identified by the same reference numerals.

This embodiment includes a step of forming the deposited layer 174 of PSG, low-melting-point glass or the like and then heat treating the deposited layer 174 for effecting glass flow after the formation of the interconnect layer consisting of the conductor layer 163a and the insulating film 164a as shown in FIG. 20D. The inclusion of such a step achieves further planarization of the boundary region between the conductor layer 163a and the sinsulating film 164a.

In the multilevel interconnect structure of FIG. 19, since an aluminum alloy, polysilicon and various other conductors are used as material for the interconnection lines, heat treatment is needed for reducing their contact resistance, through not described in the foregoing. The heat treatment may also be effected for each lamination of the structure of FIG. 19, but the heat treatment may cause grain growth of aluminum, resulting in increased irregularities of the layer surface. In this case, the multilevel interconnect structure of FIG. 19 can be given excellent contact resistance by performing heat treatment at 400° to 450° C. after completion of its fabrication process. Even if the multilevel interconnect structure of FIG. 19 is subjected to such heat treatment after completion of its fabrication, deformation of the conductor materials by the heat treatment can be prevented because the insulating film are recessed around the conductors.

In the embodiments described in the foregoing, respective interconnect layers are formed by forming a resist film on the surface of a semiconductor substrate deposited over the entire surface area with a first material, selectively etching away the first material to a predetermined thickness by a plasma deposition technique such as the ECR plasma deposition technique, and removing the resist film and the second material thereon by the lift-off technique. Therefore, the surface of each interconnect layer can be planarized. Furthermore, since the surface of each interconnect layer can be planarized, the thickness of each interconnect layer can be freely adjusted and, in addition, fine patterning of the resist film can be achieved. This makes it possible to increase the thickness of each interconnect layer to reduce the wiring resistance and parasitic capacitance, and permits reduction of dimensions in the direction parallel to the substrate surface, leading to the advantage that the packing density and operating speed of LSIs can be improved. Moreover, since the surface of each interconnect layer can be planarized, the possibility of breakage and shorting of the interconnection lines is eliminated and, consequently, the yield rate of fabrication and reliability are also raised. Besides, the same minimum pattern size can be used with respective layers.

It will be apparent that many modifications and variations may be effected without departing from the scope of the novel concepts of the present invention.

What is claimed is:

1. A semiconductor device manufacturing process comprising the steps of:
    forming a resist pattern on the surface of a semiconductor substrate;
    cutting a groove in an exposed area of the semiconductor substrate which is not covered with the resist pattern, through a dry etching technique with directionality using the resist pattern as a mask;
    converting a first gas into a plasma under an electron cyclotron resonance condition, by using microwaves, in a divergent magnetic field the intensity of which diminishes toward a specimen table in a specimen chamber, and in a plasma generating chamber, leading the plasma-converted first gas along the magnetic field into the specimen chamber adjacent the plasma generating chamber, converting a second gas introduced into the specimen chamber into a plasma by the plasma-converted first gas and applying the plasma-converted first and second gases along the magnetic field to the semiconductor substrate on the specimen table in a direct direction substantially perpendicular thereto, thereby to form a high-density insulating film of excellent directionality in the groove and on the resist pattern to a thickness substantially equal to the depth of the groove, without heating the semiconductor substrate from the outside; and removing the resist pattern and the insulating film formed thereon to thereby obtain a structure in which only the groove is filled with the insulating film.

2. A semiconductor device manufacturing process according to claim 1, wherein the first gas is $O_2$ gas, the second gas is $SiH_4$ gas and the insulating film is a silicon oxide film.

3. A semiconductor device manufacturing process according to claim 1, further including a step of removing the insulating film deposited on the side wall of the resist pattern, by an isotropic etching technique, after the insulating film forming step but before the resist pattern removing step.

4. A semiconductor device manufacturing process comprising the steps of;

(a) forming a first interconnection layer to be connected to a predetermined region of a cell on a substrate;

(b) forming a first resist pattern on the first interconnection layer;

(c) cutting a first groove in the exposed area of the first interconnection layer which is not covered with the first resist pattern, by a dry etching technique with directionality using the first resist pattern as a mask;

(d) converting a first gas into a plasma under an electron cyclotron resonance condition, through using microwaves, in a divergent magnetic field the intensity of which diminishes toward a specimen table in a specimen chamber, and in a plasma generating chamber, leading the plasma-converted first gas along the magnetic field into the specimen chamber adjacent the plasma generating chamber, converting a second gas introduced into the specimen chamber into a plasma by the plasma-converted first gas and applying the plasma-converted first and second gases along the magnetic field to the substrate on the specimen table in a direction substantially perpendicular therto, thereby to form a high-density first insulating film of excellent directionality in the first groove and on the first resist pattern to a thickness substantially equal to the depth of the first groove, without heating the substrate from the outside;

(e) removing the first resist pattern and the overlying first insulating film to thereby obtain a structure in which only the first groove is filled with the first insulating film;

(f) forming a second insulating film on the first insulating film filled in the first groove and on the first interconnection layer;

(g) forming a second resist pattern on the second insulating film;

(h) cutting a second groove in the exposed area of the second insulating film which is not covered with the second resist pattern, by a dry etching technique with directionality using the second resist pattern as a mask, to thereby partly expose the first interconnection layer;

(i) converting a third gas into a plasma under an electron cyclotron resonance condition, through using microwaves, in a divergent magnetic field, the intensity of which diminishes toward a specimen in a specimen chamber, and in a plasma generating chamber, leading the plasma-converted third gas along the magnetic field into the specimen chamber adjacent the plasma generating chamber, converting a fourth gas introduced into the specimen chamber into a plasma by the plasma-converted third gas and applying the plasma-converted third and fourth gases along the magnetic field to the substrate on the specimen table in a direction substantially perpendicular thereto, thereby to form a high-density conductive material in the second groove and on the second resist pattern to a thickness substantially equal to the depth of the second groove, without heating the substrate from the outside;

(j) removing the second resist pattern and the overlying conductive material to thereby obtain a structure in which only the second groove is filled with the conductive material; and (k) forming a second interconnection layer on the conductive material filled in the second groove and on the second insulating film.

5. A semiconductor device manufacturing process according to claim 4 further including a step of forming a first spacer layer between the steps (a) and (c) and a step of side-etching the first spacer layer by an isotropic etching technique between the steps (c) and (d), and wherein the step (c) is a step of dry-etching the first spacer layer and the first interconnection layer using the first resist pattern as a mask to thereby form the first groove and the step (e) is a step of removing the first spacer layer and the overlying first resist layer and the first insulating film.

6. A semiconductor device manufacturing process according to claim 4, wherein the first and second resist patterns are each formed by a lower resist layer, an intermediate layer and an upper resist layer laminated in this order.

* * * * *